United States Patent
Liao et al.

(10) Patent No.: US 6,498,505 B2
(45) Date of Patent: Dec. 24, 2002

(54) JIGS FOR SEMICONDUCTOR COMPONENTS

(75) Inventors: Mu-Sheng Liao, Chu-Pei (TW); Wei-Feng Lin, Hsinchu (TW); Chen-Wen Tsai, Hsinchu (TW); Ching-Jung Huang, Hsinchu (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 09/803,465

(22) Filed: Mar. 8, 2001

(65) Prior Publication Data

US 2002/0125902 A1 Sep. 12, 2002

(51) Int. Cl.⁷ .............................................. G01R 31/02
(52) U.S. Cl. .................................... 324/755; 324/158.1
(58) Field of Search ................................ 324/755, 754, 324/756, 158.1; 269/21; 294/64.1; 29/743, 758

(56) References Cited

U.S. PATENT DOCUMENTS

| | | | | |
|---|---|---|---|---|
| 3,466,079 A | * | 9/1969 | Walter et al. ............... 294/64.3 |
| 3,617,045 A | * | 11/1971 | Da Costa et al. ........... 248/363 |
| 4,121,865 A | * | 10/1978 | Littwin, Sr. .................... 294/2 |
| 4,707,012 A | * | 11/1987 | Takagi ........................ 294/64.1 |
| 5,149,162 A | * | 9/1992 | Focke et al. ............... 294/64.1 |
| 5,284,287 A | * | 2/1994 | Wilson et al. ......... 228/180.22 |
| 5,342,068 A | * | 8/1994 | Large ........................... 269/21 |
| 5,516,125 A | * | 5/1996 | McKenna ................. 228/44.7 |

* cited by examiner

Primary Examiner—Michael Sherry
Assistant Examiner—Tung X Nguyen

(57) ABSTRACT

A testing jig for semiconductor components, mainly comprising a main jig body, wherein on its bottom is provided with a retrieving head. While on the center of the bottom of the retrieving head is provided with a concave space, around which is arranged a plurality of air holes which are connected with the internal airways and also connected with the air inlet on the top of the main body. Furthermore, on the bottom of the main jig body is provided with two buffer blocks on opposite sides, which can prevent the chip on the center of the base board from being contacted with external force or foreign objects in the process of retrieving the base board during testing.

5 Claims, 4 Drawing Sheets

JIGS FOR SEMICONDUCTOR COMPONENTS

FIELD OF THE INVENTION

The present invention generally relates to a jig for semiconductor components in the ball grid array (BAG) packaging, and more specifically to a testing jig employed in the Flip-Chip BGA base board to prevent chips from contacting with external force or foreign objects during testing.

BACKGROUND OF THE INVENTION

In the prior art of plastic BGA packaging, a semiconductor base board is protected by a layer of molding compound coating so that the chip under test is not susceptible to damages. However, the new semiconductor product at present time is a base board packaged by FlipChip BGA (FCBGA) on which the chip is bare without the protection of the molding compound. If the traditional tools press down during test, the direct contact with the chip will damage the chip under test. Consequently, the object of the present invention is to prevent the chip from being damaged by external force or by the contact of foreign objects during test.

Static-Electricity is omnipresent, which may occur when two objects of different substances being rubbed together. The internal electric circuit in chips will be affected by the instantaneous high voltage which arises from contacting the objects with static-electricity. The damage caused by the Electro-Static Discharge (ESD) is the main potential factor in causing the failure of the electronic system. Consequently, the present invention also aims to avoid unnecessary contact between the chip and the testing set, and thus reduce the occurrence of ESD.

SUMMARY OF THE INVENTION

The primary object of the present invention is to provide a jig which can improve the success rate of production for semiconductor components. Accordingly, an object is to prevent the contact between the main jig body and the chip in the center of the base board when the main jig body lifts the FCBGA base board. Consequently, no damage in the chip would occur when the jig retrieves or presses the chip during test and thus the success rate of production can be increased.

Another object of the present invention is to provide a jig which is equipped with the function of preventing static-electricity for semiconductor components. No contact occurs between the chip and all other objects when the main jig body lifts the FCBGA base board or conducts test. Consequently, the possibility of inducing static-electricity can be reduced, and the function of preventing static-electricity is accomplished.

The following detailed description will further elaborate the present invention with reference to the following figures and detailed descriptions so as to facilitate better understanding of the procedures and the details of the present invention.

DETAILED DESCRIPTION OF THE INVENTION

Figure 1:
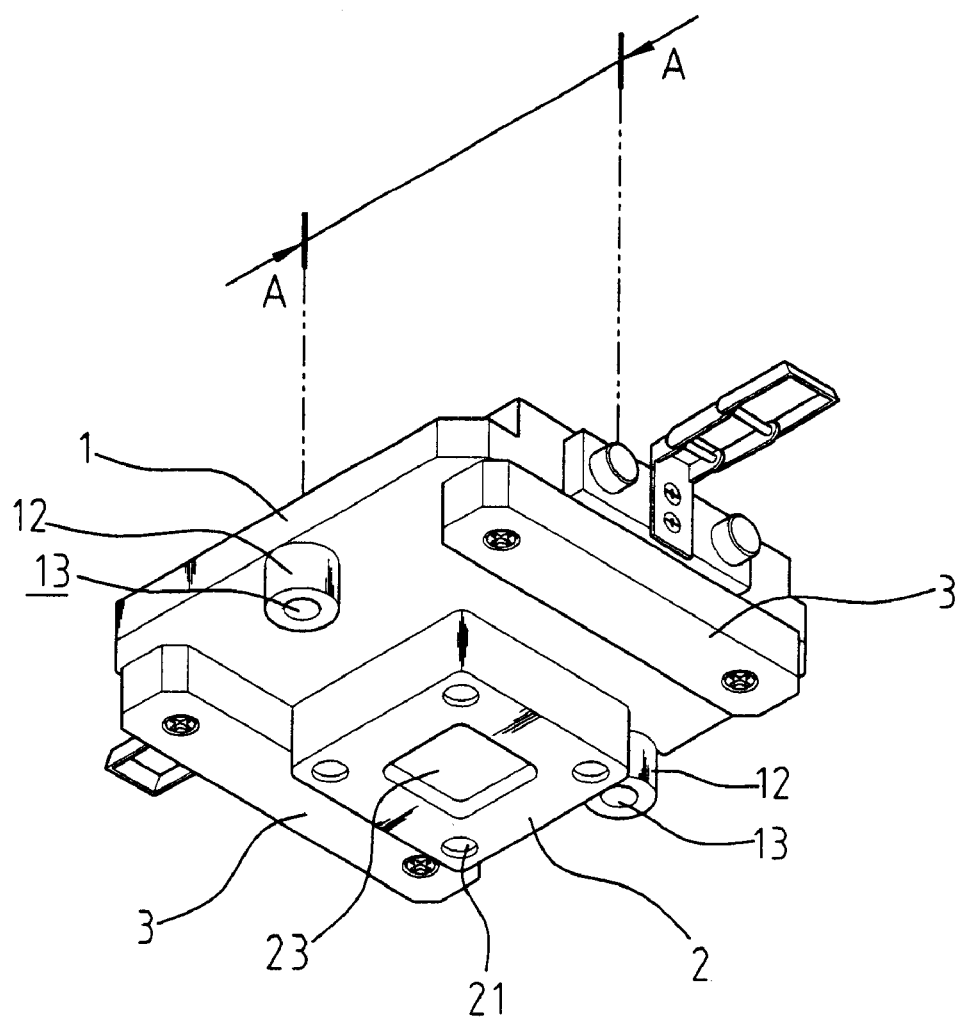
FIG. 1 is a top perspective view of the present invention.
Figure 2:
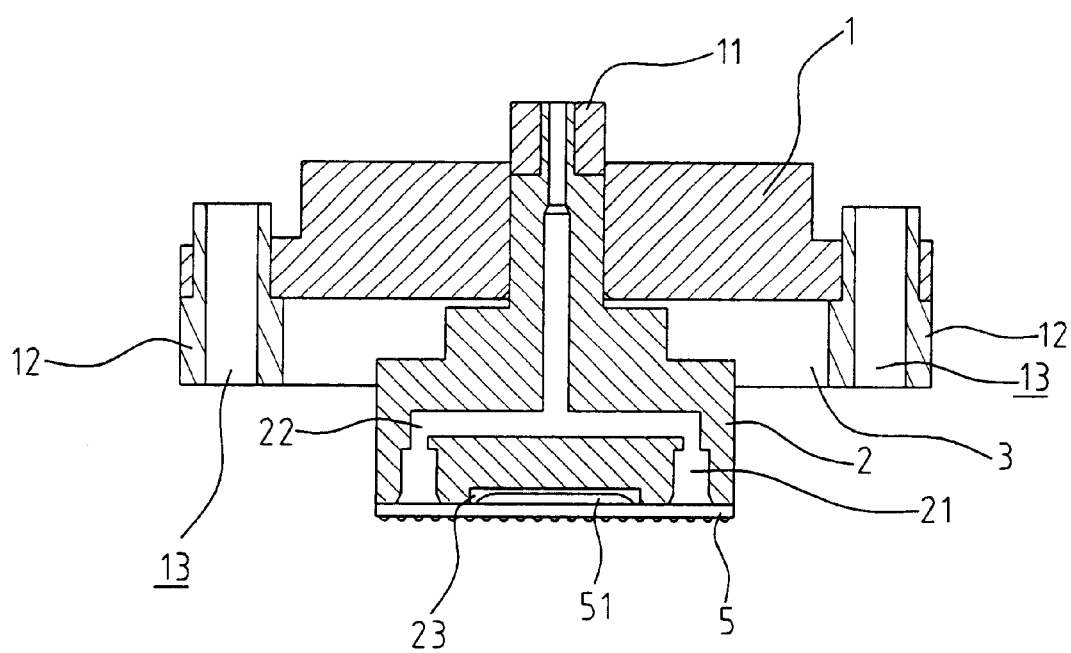
FIG. 2 is a cross-sectional view taken through A—A line of FIG. 1 with an addition of the base board on the bottom.

The perspective view and the cross-sectional view of the present invention are shown in FIGS. 1 and 2, respectively. The present invention is applied in the field of testing jig for the semiconductor components in the FCBGA packaging, wherein the testing jig retrieves the FCBGA base board and the testing die so as to conduct testing. The main structure includes a man jig body 1, wherein on the bottom of the main body 1 is provided with a retrieving head 2 which is smaller in size than the main body 1 and close to the base board 5. The main jig body is provided with an air inlet 11 on its top, and a plurality of air holes 21 are provided on the bottom of the retrieving head 2. The retrieving head 2 is also provided with a plurality of airways 22 internally as air passages to suck other objects to the main jig body. By exerting vacuum sucking force through the air holes 21 of the retrieving head 2, the base board 5 can be retrieved for testing.

Figure 3:
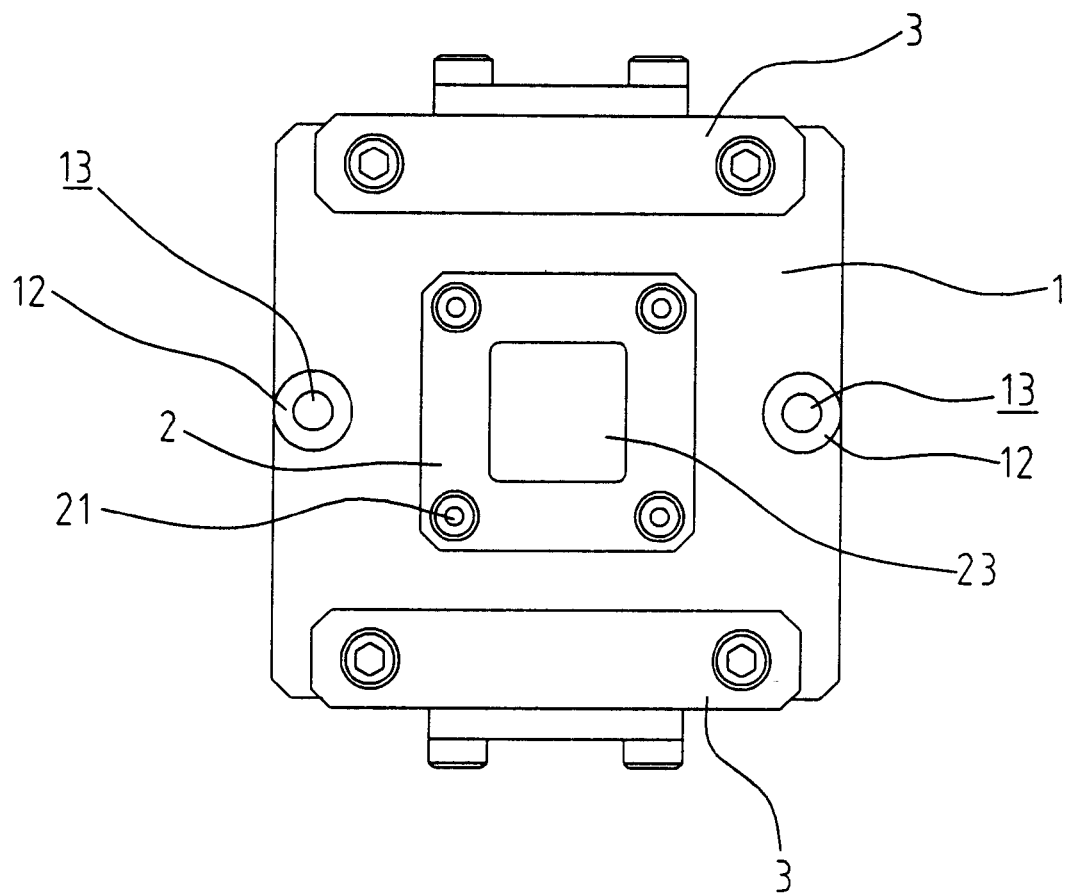
FIG. 3 is a top view of the present invention.

The main improvement of the present invention is to provide a concave space 23 on the center of the bottom of the retrieving head 2, as shown in FIGS. 1–3. The shape of the space 23 is to correspond to the chip 51 located on the center of the base board 5, wherein the size of the space 23 is slightly larger than the apparent size of the chip 51. Whereas, the four corners around the space 23 on the bottom of the retrieving head 2 are provided with the plurality of air holes 21. When the main jig body 1 is to retrieve the base board 5 for testing, the vacuum induced by the air holes 21 around the four corners of the retrieving head 2 can suck up the base board 5, wherein the chip 51 on the center of the base board 5 is situated right at the empty space 23, without contacting with any other objects. While the bottom of the retrieving head 2 is pressing against the base board 5 during testing, no external force is exerted to damage the chip 51 and consequently the success rate of production can be improved. The design can also reduce the occurrence of the ESD, achieving the purpose of preventing static-electricity from occurring.

On the bottom of the main jig body 1 is additionally provided with two buffer blocks 3 on opposite sides of the retrieving head 2, whose main function is limiting the downward movement of the retrieving head 2 to prevent the base board 5 from pressing too low during testing, and thus avoid defog the tin balls on the bottom. The thickness of the buffer blocks 3 can be changed according to the practical need,. Whereas, on the bottom of the main body 1 is provided with the sockets 12 on opposite sides of the retrieving head 2, forming the guiding holes 13, which can guide the whole set into the correct position during the movement toward the testing die, facilitating further testing work. The buffer blocks 3 and the sockets 12 are made of wear-resistant materials.

Figure 4:
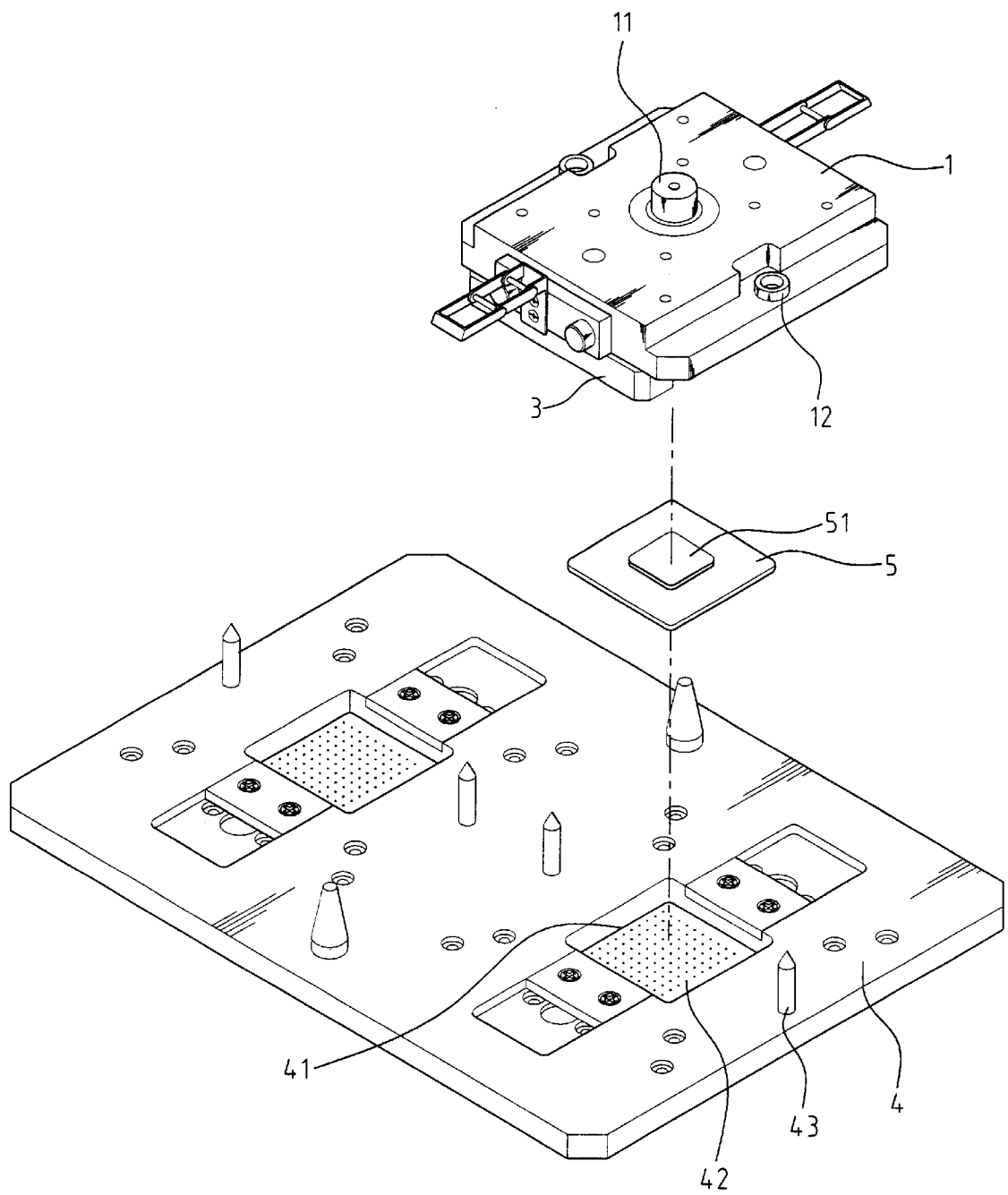
FIG. 4 is an exploded perspective view of the present invention in use.

The exploded view of the testing die matched with the present invention in use is shown in FIG. 4. On the center of the die 4 is provided with an accommodating space 41, wherein the retrieving head 2 is located. On the bottom of the accommodating space 41 is provided with a plurality of probes 42, whose positions and number are to correspond to the plurality of connecting legs (tin balls). On both sides of the accommodating space 41 of the die 4 are provided with a plurality of protruded pillars 43 so as to guide the main jig body 1 into the correct position upon lowering process. In testing the base board 5, the main jig body 1 sucks up the base board 5 to its bottom, lifting the chip 51 to the empty space 23, and moves the chip 51 with the help of other objects to the place above the die 4. The main jig body 1 then slowly lowers with the protruded pillars 43, coming into the guiding holes 13, and the retrieving head 2 moves into the accommodating space 41 with the probes 42 contacting the plurality of connecting legs on the bottom of the base board 5. Furthermore, the buffer blocks 3 are set against the top of the die 4 so as to prevent the main jig body from lowering too much, thereby avoiding the deformation of the tin balls on the bottom of the base board 5. Consequently, during the process of retrieving or testing, the chip 51 of the base board 5 will not be damaged by externally applied forces or the contacts of foreign objects, and furthermore reduce the probability of occurrence of the ESD, thereby enhancing the success rate of production.

It should be understood that the above only describes an example of one embodiment of the present invention, and that various alternations or modifications may be made thereto without departing the spirit of this invention. Therefore, the protection scope of the present invention should be based on the claims described later.

What is claimed is:

1. A jig for testing semiconductor components, comprising:

a main body having a top side formed with an air inlet;

a retrieving head protruded downward from a center portion of a bottom side of said main body, said retrieving head having a centered bottom recess formed with a concave space, a plurality of air holes formed on said retrieving head around said centered bottom recess;

a plurality of air ways formed in said retrieving head for connecting said plurality of air holes to said air inlet; and a pair of buffer blocks attached on said bottom side of said main body, said buffer blocks being positioned on two opposite sides of said retrieving head for limiting downward movement of said retrieving head;

wherein said bottom side of said main body is substantially larger than said retrieving head for accommodating said retrieving head and said buyer blocks.

2. The jig for testing semiconductor components as claimed in claim 1, wherein said concave space has a size slightly larger than the size of a chip under test.

3. The jig for testing semiconductor components as claimed in claim 1, wherein said retrieving head has a substantially rectangular bottom and said plurality of air holes are formed on four corners of said rectangular bottom around said centered bottom recess.

4. The jig for testing semiconductor components as claimed in claim 1, further comprising two guiding sockets formed on said bottom side of said main body, said guiding sockets being disposed on two opposite sides of said retrieving head and each guiding socket having a guiding hole.

5. The jig for testing semiconductor components as claimed in claim 1, wherein each of said buffer block has a length larger than the size of said retrieving head but smaller than the size of said bottom side of said main body.

* * * * *